United States Patent
Ozaki et al.

(10) Patent No.: US 12,513,875 B2
(45) Date of Patent: Dec. 30, 2025

(54) ELECTRONIC CONTROL DEVICE WITH RESIN CASE

(71) Applicant: Hitachi Astemo, Ltd., Hitachinaka (JP)

(72) Inventors: Kiyoharu Ozaki, Hitachinaka (JP); Yang Xu, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 160 days.

(21) Appl. No.: 18/560,079

(22) PCT Filed: Feb. 8, 2022

(86) PCT No.: PCT/JP2022/004799
§ 371 (c)(1),
(2) Date: Nov. 9, 2023

(87) PCT Pub. No.: WO2023/276231
PCT Pub. Date: Jan. 5, 2023

(65) Prior Publication Data
US 2024/0244808 A1    Jul. 18, 2024

(30) Foreign Application Priority Data
Jul. 1, 2021    (JP) .................................. 2021-109835

(51) Int. Cl.
*H05K 9/00*    (2006.01)
*H05K 7/14*    (2006.01)

(52) U.S. Cl.
CPC ............. *H05K 9/0007* (2013.01); *H05K 7/14* (2013.01)

(58) Field of Classification Search
None
See application file for complete search history.

(56) References Cited

U.S. PATENT DOCUMENTS

| | | | |
|---|---|---|---|
| 6,426,881 B1 * | 7/2002 | Kurz | H05K 9/0016 361/752 |
| 7,259,969 B2 * | 8/2007 | Zarganis | H01R 13/6595 361/800 |

(Continued)

FOREIGN PATENT DOCUMENTS

| | | |
|---|---|---|
| JP | 2001-185888 A | 7/2001 |
| JP | 2010-141021 A | 6/2010 |

(Continued)

OTHER PUBLICATIONS

International Search Report (PCT/ISA/210) issued in PCT Application No. PCT/JP2022/004799 dated May 10, 2022 with English translation (4 pages).

(Continued)

*Primary Examiner* — Allen L Parker
*Assistant Examiner* — Christopher L Augustin
(74) *Attorney, Agent, or Firm* — Crowell & Moring LLP (57) ABSTRACT

An object of the present invention is to provide an electronic control device that can be improved in EMC resistance when a resin case is used without using a metal case. An electronic control device of the present invention includes: a substrate 101; an electronic component 302 disposed on an electronic component mounting surface 101a of the substrate 101; and a resin case 100 that houses the substrate 101. The case 100 includes a conductive member 102 on a surface facing the electronic component mounting surface 101a of the substrate 101. The substrate 101 includes a plurality of conductive surface-mounted members 301 mounted on the electronic component mounting surface 101a to surround the electronic component 302. The plurality of conductive surface-mounted members 301 are arranged to be separated from each other on the electronic component mounting (Continued)

surface 101a and form electrical shielding by coming into contact with the conductive member 102.

13 Claims, 11 Drawing Sheets

(56) References Cited

U.S. PATENT DOCUMENTS

| | | | | |
|---|---|---|---|---|
| 2015/0289419 | A1* | 10/2015 | Kouya | H05K 9/0037 |
| | | | | 333/12 |
| 2021/0307221 | A1* | 9/2021 | Nakagawa | H01L 23/04 |
| 2022/0132708 | A1 | 4/2022 | Adachi et al. | |

FOREIGN PATENT DOCUMENTS

| | | |
|---|---|---|
| JP | 2011-221541 A | 11/2011 |
| JP | 2020-13806 A | 1/2020 |
| JP | 2021-158202 A | 10/2021 |
| WO | WO 2020/194652 A1 | 10/2020 |

OTHER PUBLICATIONS

Japanese-language Written Opinion (PCT/ISA/237) issued in PCT Application No. PCT/JP2022/004799 dated May 10, 2022 with English translation (7 pages).

* cited by examiner

ELECTRONIC CONTROL DEVICE WITH RESIN CASE

TECHNICAL FIELD

The present invention relates to an electronic control device suitable for use in a vehicle.

BACKGROUND ART

JP 2011-221541 A (PTL 1) describes a photoelectric conversion module in which a substrate on which various circuit components are mounted is provided in a case having an upper case part and a lower case part (see paragraphs 0019 and 0020). In the photoelectric conversion module of PTL 1, the upper case part and the lower case part are formed of conductive metal.

WO 2020/194652 (PTL 2) describes a shield case mounted on a substrate. The shield case includes: a case body that covers at least a portion of a circuit pattern provided on a mounting surface of a substrate; a flange section that extends from an outer peripheral edge section of the case body along the mounting surface in a direction away from the case body; and a bent section that bends and extends from an outer peripheral edge section of the flange section in a direction away from the mounting surface. The shield case is mounted on the substrate by means of bonding members provided: between the flange section and a case-mounting region that is provided on the substrate and in which the flange section is placed; and between the bent section and the case-mounting region (see Abstract). Moreover, the shield case is mounted on the substrate (radio-frequency circuit substrate) using solder for the bonding member provided between the flange section and a ground pattern on which the flange section is disposed and between the bent section and the ground pattern (see paragraph 0017).

CITATION LIST

Patent Literatures

PTL 1: JP 2011-221541 A
PTL 2: WO 2020/194652

SUMMARY OF INVENTION

Technical Problem

The case of PTL 1 and the shield case (hereinafter, referred to as a case) of PTL 2 are made of metal. Use of a metal case results in an increase in costs. In a case where the cases of PTL 1 and PTL 2 are used for an electronic control device, there is the challenge of reducing costs. In addition, in the case of the shield case of PTL 2, since the shield case is mounted on the substrate by performing soldering, it is not possible to perform an in-circuit test (ICT), Automated Optical Inspection (AOI), and X-ray inspection for checking electrical connection of mounted components. Therefore, when the case of PTL 2 is used for an electronic control device, there is a problem in verification of reliability.

It is effective to use a resin case for the above-described problems, but in that case, measures for electromagnetic compatibility (EMC) are required.

An object of the present invention is to provide an electronic control device that can be improved in EMC resistance when a resin case is used without using a metal case.

Solution to Problem

In order to achieve the object described above, an example of an electronic control device according to the present invention includes: a substrate; an electronic component disposed on an electronic component mounting surface of the substrate; and a resin case that houses the substrate. The case includes a conductive member on a surface facing the electronic component mounting surface of the substrate. The substrate includes a plurality of conductive surface-mounted members mounted on the electronic component mounting surface to surround the electronic component. The plurality of conductive surface-mounted members are arranged to be separated from each other on the electronic component mounting surface and form electrical shielding by coming into contact with the conductive member.

Advantageous Effects of Invention

According to the present invention, it is possible to provide an electronic control device that can be improved in EMC resistance when a resin case is used without using a metal case.

Objects, configurations, and effects other than those described above will be clarified by the following description of embodiments.

DESCRIPTION OF EMBODIMENTS

An electronic control device according to the present invention is suitable for use as an in-vehicle electronic control device and is suitable for configuring an information safety system electronic control unit (ECU). In the information safety system ECU, it is necessary to cope with high-speed communication. In a case where high-speed communication is realized, electromagnetic such noise as radio-frequency electromagnetic radiation noise and electric noise emitted from an electronic circuit is produced, and the number of noise sources increases. The information safety system ECU needs more EMC measures against such an increase in electromagnetic noise. In addition, in the ECU, there is also a demand for a cost reduction of an ECU housing, and it is essential to achieve both improvement of EMC characteristics and the cost reduction. Moreover, the electronic control device according to the present invention is not limited to an in-vehicle electronic control device.

Hereinafter, examples of the present invention will be described in detail with reference to the drawings. Moreover, configurations represented by the same reference numerals in the examples have similar functions unless otherwise specified, and thus redundant description will be omitted.

Example 1

Figure 1:
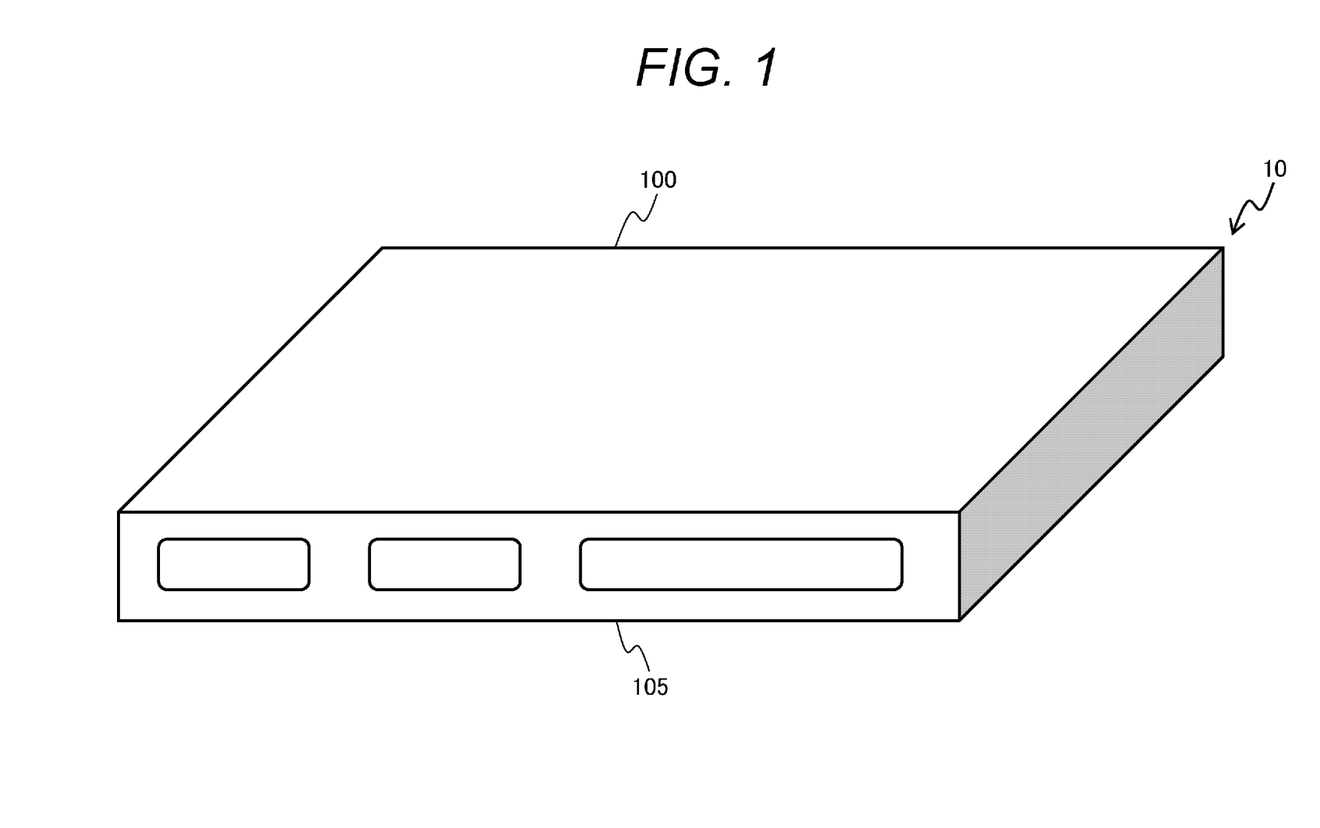
FIG. 1 is a perspective view illustrating the external appearance of an electronic control device 10 according to a first example.
Figure 2:
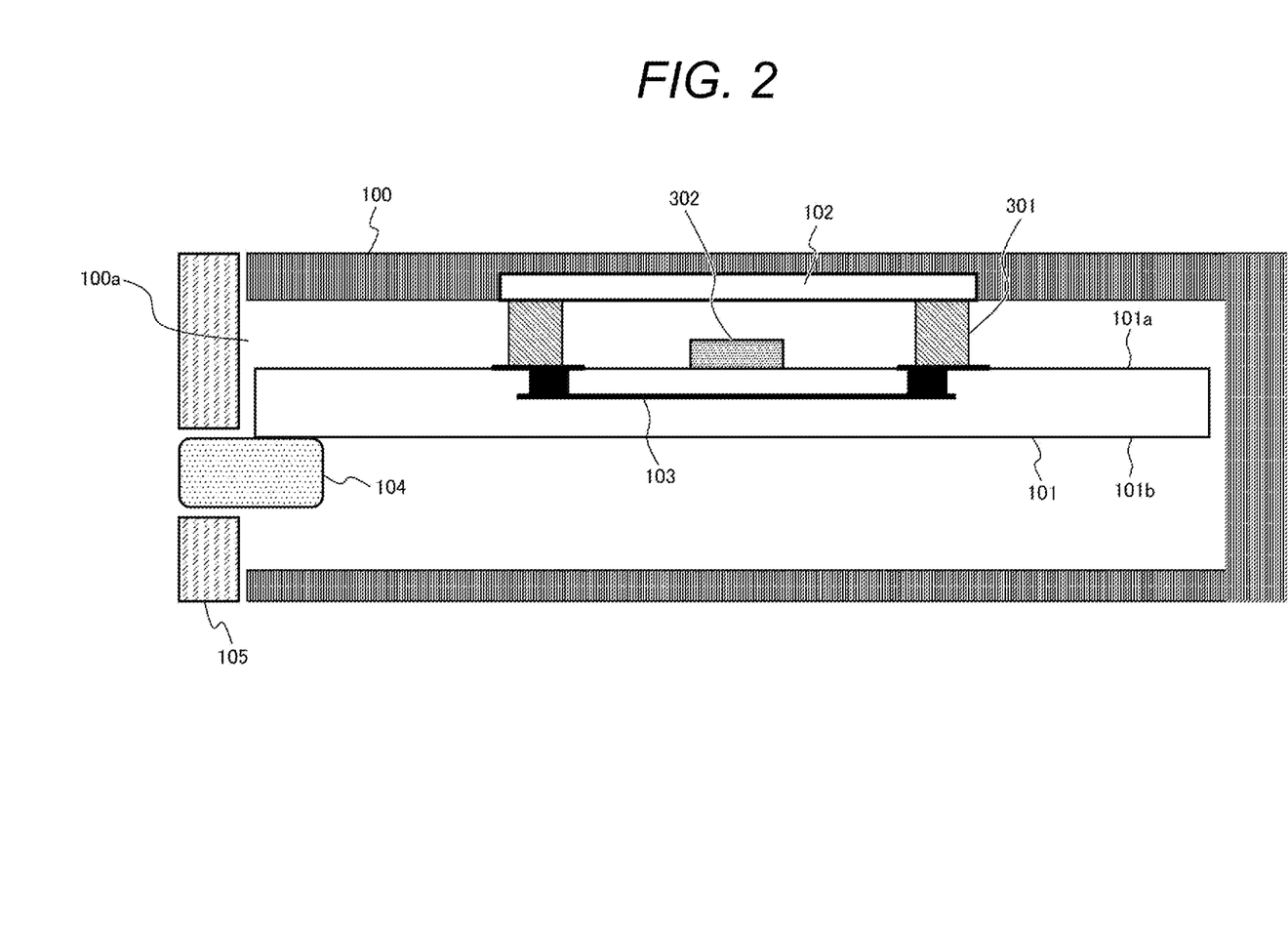
FIG. 2 is a cross-sectional view of the electronic control device 10 in a substrate insertion direction according to the first example.

A first example of the present invention will be described with reference to FIGS. 1 and 2. FIG. 1 is a perspective view illustrating the external appearance of an electronic control device 10 according to the first example. FIG. 2 is a cross-sectional view of the electronic control device 10 in a substrate insertion direction according to the first example.

As illustrated in FIG. 1, the electronic control device 10 includes a substrate 101, a case 100 that houses the substrate 101, and a cover 105. The case 100 and the cover 105 are made of a material less expensive than metal, and for example, a resin case and a resin cover are used. The case 100 is formed in a bottomed cylindrical shape having a space in which the substrate 101 is housed, one end of the case is closed by a member constituting the case 100, and the cover 105 is attached to an opening portion 100a at the other end thereof. Moreover, the case 100 of this example has a rectangular cross section perpendicular to the insertion direction of the substrate 101.

As illustrated in FIG. 2, an electronic component 302 is mounted on the substrate 101, and at least two or more conductive members 301 are mounted in an independent arrangement to surround the electronic component 302. The conductive member 301 is a conductor or a dielectric, is a member surface-mounted on the substrate 101, and is referred to as a conductive surface-mounted member in order to distinguish the conductive member 301 from the conductive member 102 to be described below.

A conductive member 102 is provided on a surface of the case 100, this surface facing the electronic component mounting surface 101a of the substrate 101 on which the electronic component 302 is mounted. The conductive member 102 is a member having conductivity, and is made of, for example, a metal plate or a conductive resin.

The substrate 101 has a signal ground (SG) 103. The signal ground 103 is provided on the electronic component mounting surface 101a of the substrate 101, an electronic component non-mounting surface 101b, or an inner layer of the substrate 101. In this example, an example is described in which the signal ground 103 is provided on the inner layer of the substrate 101, and the electronic component 302 is disposed between the signal ground 103 and the conductive member 102 in a thickness direction of the substrate 101.

A radiation route of radiation noise produced from the electronic component 302 is, for example, a reduced gigabit media independent interface (RGMII) line, and the operation frequency is about 125 MHz. If the above radiation route is not sealed or blocked, radiation noise leaks to the outside. In this example, electrical shielding is formed by setting the electric potential of the conductive surface-mounted member 301 and the electric potential of the conductive member 102 to the same electric potential. In this example, the conductive surface-mounted member 301 is brought into contact with the conductive member 102 to have the same electric potential, thereby forming the electrical shielding. In this case, the conductive surface-mounted member 301 and the conductive member 102 preferably have the same electric potential as that of the substrate SG 103. Therefore, the conductive surface-mounted member 301 may be used, and the conductive member 102 may be set to have the same electric potential as that of the substrate SG 103.

By setting the electric potential around the electronic component 302 to the same electric potential by the conductive surface-mounted member 301 and the conductive member 102, it is possible to suppress a noise electric field, and it is possible to suppress leakage of radio-frequency radiation noise radiating from a noise source to the outside.

The electronic component mounting surface 101a is a surface on which the electronic component 302 that needs to have electrical shielding is mounted, and an electronic component the does not need to have electrical shielding may be mounted on a surface (electronic component non-mounting surface) 101b opposite to the electronic component mounting surface 101a. In configuring the electrical shielding, the electronic component 302 is preferably disposed between the signal ground 103 and the conductive member 102 in the thickness direction of the substrate 101, and in this case, the signal ground 103 is preferably disposed on at least one of the inner layer of the substrate 101 and the electronic component non-mounting surface 101b.

The substrate 101 is inserted into the case 100 through the opening portion 100a of case 100 and is attached to an inside of case 100 by being allowed to slide toward a back side of case 100.

Effects of an aspect of the first example configured as described above will be described. By setting the vicinity of the electronic component 302 to have the same electric potential by the substrate SG 103, the conductive surface-mounted member 301, and the conductive member 102, shielding can be formed, and radiation noise can be reduced. In addition, since only the conductive surface-mounted member 301 is mounted on the substrate 101 without mounting a shield, it is possible to perform inspection using AOI and ICT after assembling the substrate 101. Consequently, conventional inspection equipment can be used, thereby eliminating the need for new inspection equipment, and resulting in a reduction in costs.

In addition, a metal housing has been often used for the electronic control device, but in the electronic control device 10 of this example, the case 100 is made of resin, and cost reduction can be realized.

As described above, the in-vehicle electronic control device 10 according to this example includes a substrate 101, an electronic component 302 disposed on the electronic component mounting surface 101a of the substrate 101, and a resin case 100 that houses the substrate 101. The case 100 includes the conductive member 102 on a surface facing the electronic component mounting surface 101a of the substrate 101. The substrate 101 includes a plurality of conductive surface-mounted members 301 mounted on the electronic component mounting surface 101a to surround the electronic component 302. The plurality of conductive surface-mounted members 301 are arranged to be separated from each other on the electronic component mounting surface 101a and form electrical shielding by coming into contact with the conductive member 102.

Figure 3:
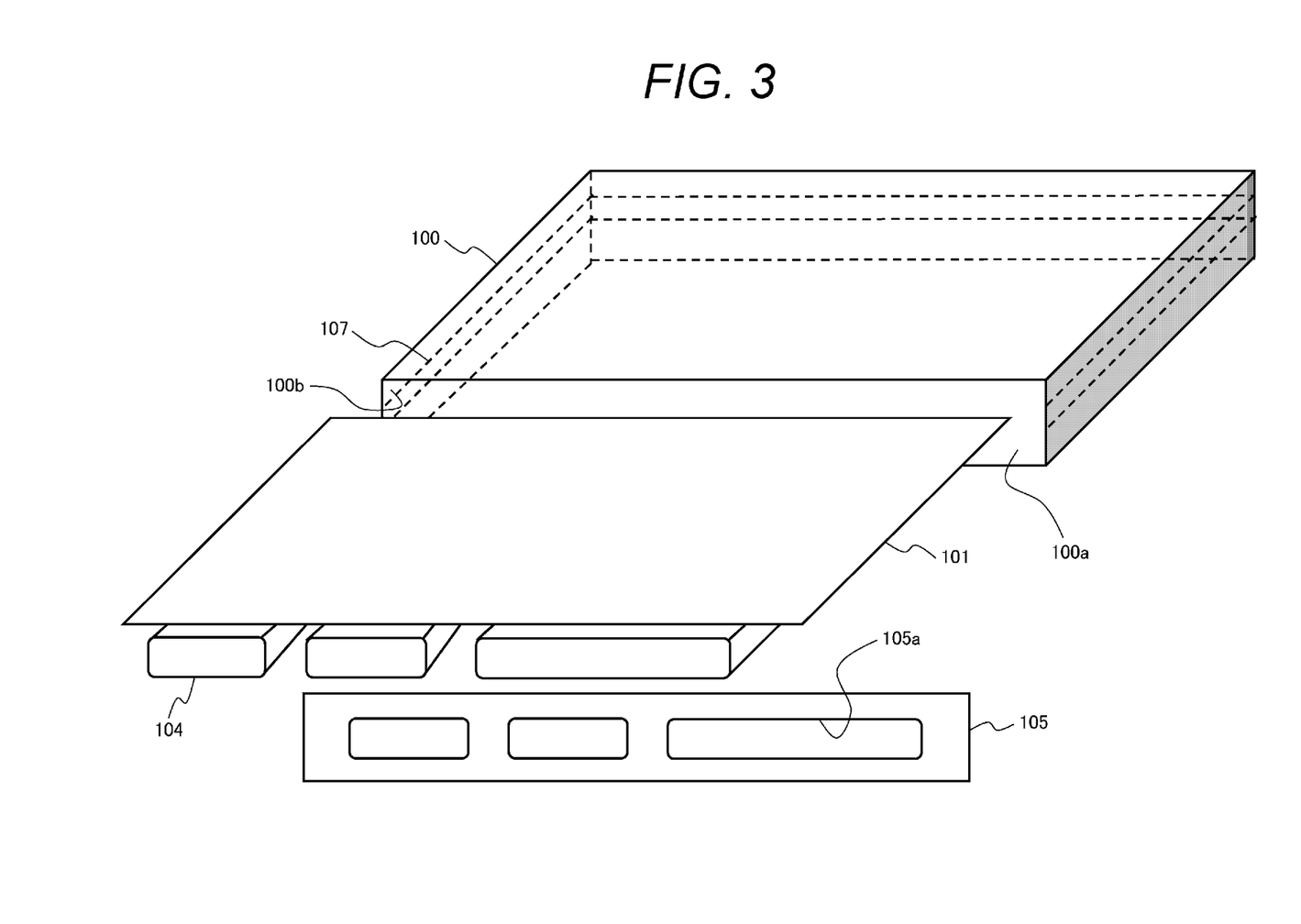
FIG. 3 is an exploded perspective view of an electronic control device 10 according to an example of the present invention.
Figure 4:
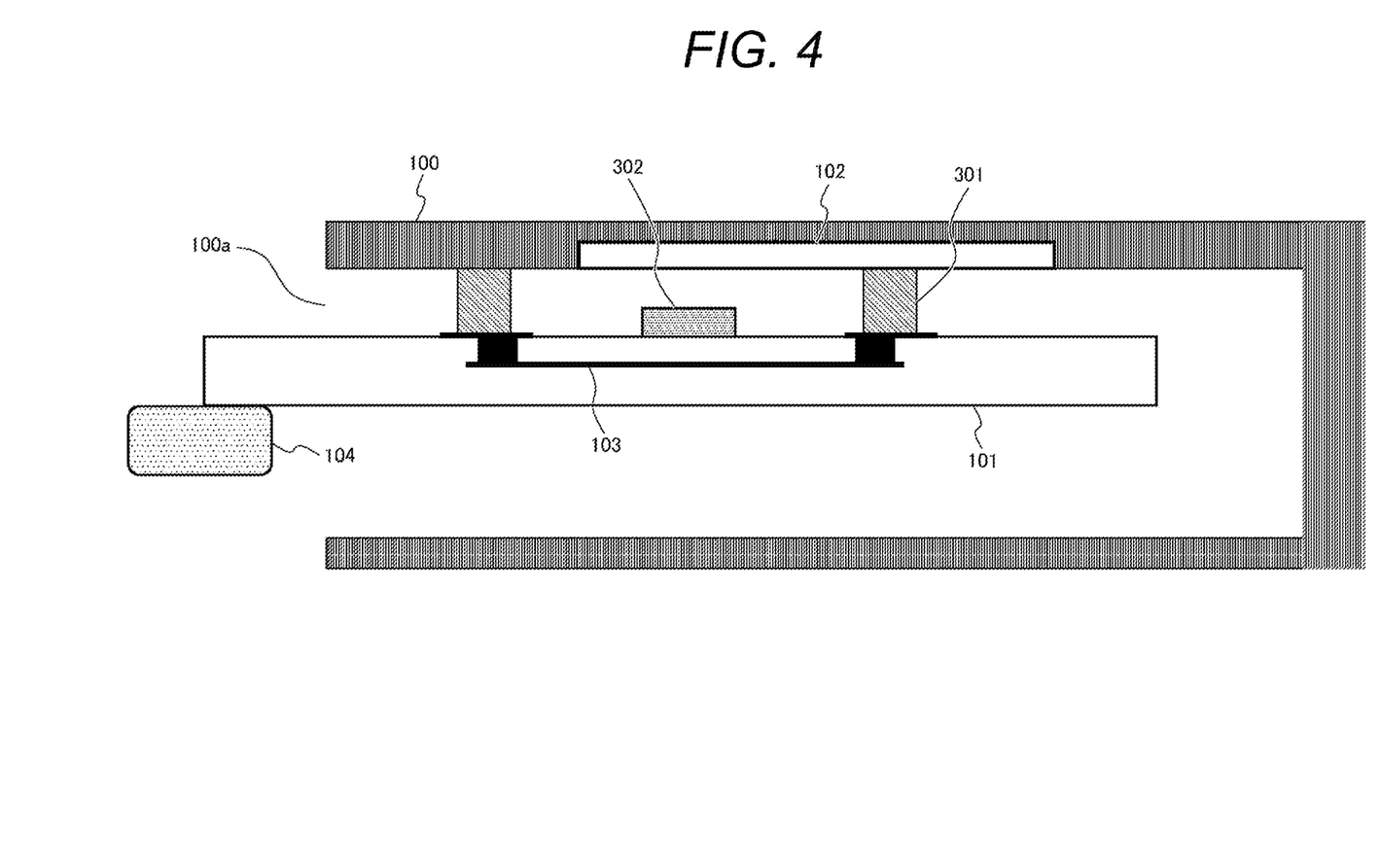
FIG. 4 is a cross-sectional view of the electronic control device 10 in a substrate insertion direction according to the example of the present invention.

Next, a mounting structure of substrate 101 on the case 100 will be described with reference to FIGS. 3 and 4. FIG. 3 is an exploded perspective view of the electronic control device 10 according to an example of the present invention. FIG. 4 is a cross-sectional view of the electronic control device 10 in the substrate insertion direction according to the example of the present invention. Moreover, FIG. 4 illustrates a state in the middle of inserting the substrate 101 into the case 100.

As illustrated in FIG. 3, the case 100 has the opening portion 100a. An insertion guide 107 is provided on a side wall 100b inside the case 100. The substrate 101 is attached to the case 100 by being allowed to slide and be inserted following the guide 107 from the opening portion 100a. The substrate 100 has a connector 104 provided for electrical connection with an external device. After the substrate 101 is attached to the case 100, the cover 105 is attached to the case 100 to close the opening portion 100a of the case 100. In this case, the cover 105 is attached to case 100 such that the connector 104 is exposed from the opening portion 105a. With the configuration illustrated in FIG. 3, there is no need to perform a screw tightening step for fixing the substrate 101 to the case 100, and the workability is improved.

As illustrated in FIG. 4, the conductive mounting member 301 and the conductive member 102 provided on the substrate 101 are brought into contact with each other simultaneously with insertion of the substrate 101. FIG. 4 illustrates a state where the substrate 101 is being inserted into case 100 and illustrates a state where the conductive mounting member 301 positioned on the back side of the case 100 is in contact with the conductive member 102. In a state where attachment of substrate 101 to case 100 is completed, the conductive mounting member 301 positioned on the opening portion 100a side is also brought into contact with the conductive member 102.

The conductive mounting member 301 is electrically connected to the signal ground 103 at a stage of being mounted on the substrate 101. Hence, in a state where the attachment of the substrate 101 to the case 100 is completed, the conductive member 102 is electrically connected to the signal ground 103 via the conductive surface-mounted member 301, and the substrate SG 103, the conductive surface-mounted member 301, and the conductive member 102 have the same electric potential, so that electrical shielding is formed. By setting the conductive surface-mounted member 301 and the conductive member 102 to have the same electric potential, it is possible to suppress the noise electric field, and it is possible to suppress the leakage of the radio-frequency radiation noise radiating from the noise source to the outside. By providing the conductive member 102 inside the case 100, the case 100 made of resin can be used, so that the costs can be reduced.

Figure 5:
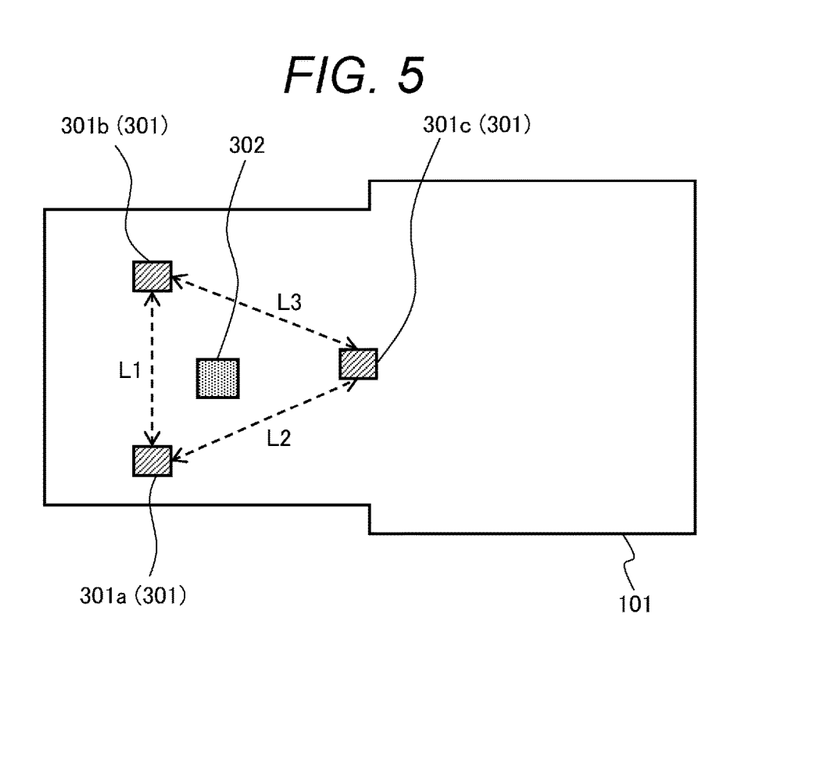
FIG. 5 is a top view of a substrate 101 of the electronic control device 10 according to the example of the present invention.

Next, the arrangement of the conductive surface-mounted member 301 will be described with reference to FIG. 5. FIG. 5 is a top view of the substrate 101 of the electronic control device 10 according to the example of the present invention.

At least two or more conductive surface-mounted members 301 are provided around the electronic component 302 on the substrate 101. That is, the plurality of conductive surface-mounted members 301 are provided on the electronic component mounting surface 101a of the substrate 101. Here, regarding intervals between the conductive surface-mounted members 301, three conductive surface-mounted members are arranged such that an interval between a conductive surface-mounted member 301a and a conductive surface-mounted member 301b is represented by L1, an interval between the conductive surface-mounted member 301a and a conductive surface-mounted member 301c is represented by L2, and an interval between the conductive surface-mounted member 301b and the conductive surface-mounted member 301c is represented by L3.

The plurality of conductive surface-mounted members 301 is arranged to surround the electronic component 302. Although FIG. 5 illustrates a case where the electronic component 302 is surrounded by the three conductive surface-mounted members 301a, 301b, and 301c, the electronic component 302 can be surrounded by two conductive surface-mounted members. For example, by forming the two conductive surface-mounted members 301a and 301b in FIG. 5 as one continuous conductive surface-mounted member, the electronic component 302 can be surrounded by the two conductive surface-mounted members.

Here, a wavelength of a noise component emitted by the electronic component 302 is represented by $\lambda$.

When the arrangement intervals L1, L2, and L3 of the conductive surface-mounted members 301a, 301b, and 301c are $\lambda/2$, resonance occurs and an amount of electromagnetic interference (EMI) radiation is maximized. Therefore, the arrangement intervals L1, L2, and L3 of the conductive surface-mounted members 301a, 301b, and 301c may be intervals set to be smaller than $\lambda/2$ with respect to the wavelength $\lambda$ of the noise component generated by the electronic component 302. With such a configuration, noise radiation up to $\lambda/2$ from gaps between the plurality of conductive surface-mounted members 301 can be reduced, so that EMC resistance can be improved. In addition, in adjusting the intervals between the conductive surface-mounted members 301, a large mounting space for the electronic component 302 can be secured by minimizing the number of the conductive surface-mounted members 301, and the cost can be reduced.

Figure 6:
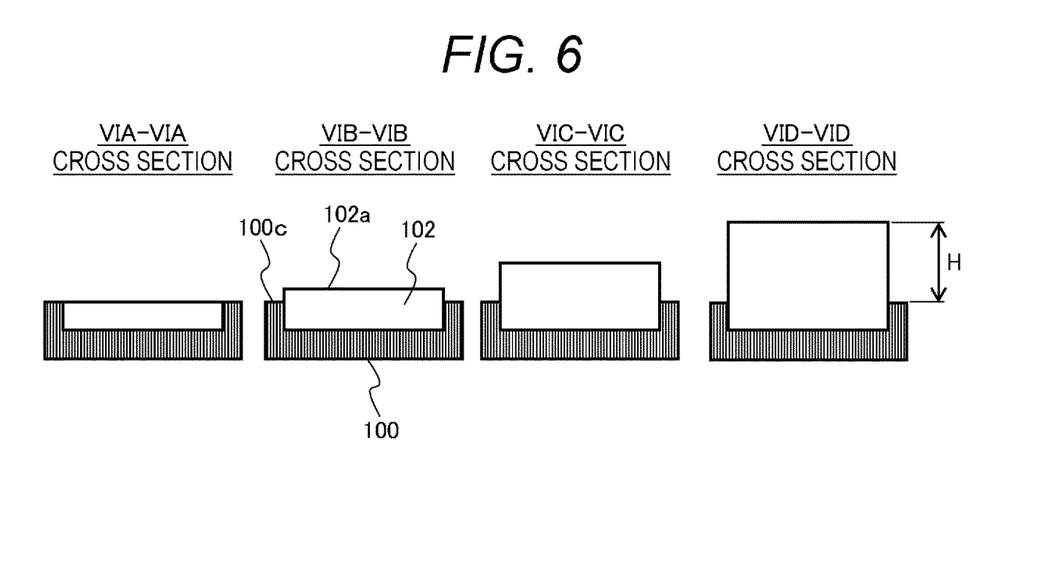
FIG. 6 is a view illustrating a modification example of a conductive member 102 according to the present invention and is a cross-sectional view of the conductive member 102 as viewed from in front thereof.
Figure 7:
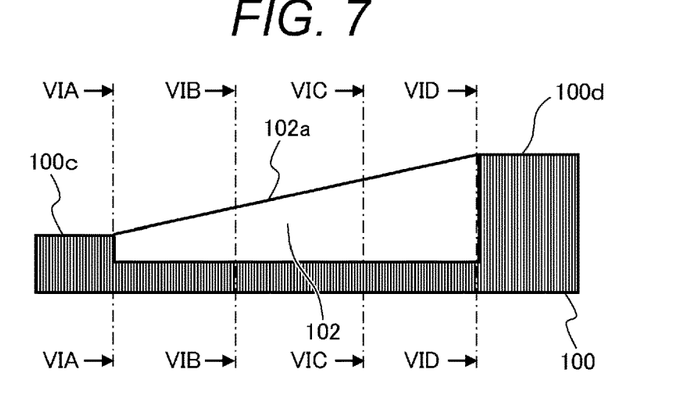
FIG. 7 is a view illustrating the modification example of the conductive member 102 according to the present invention and is a cross-sectional view of the conductive member 102 as viewed from a side.
Figure 8:
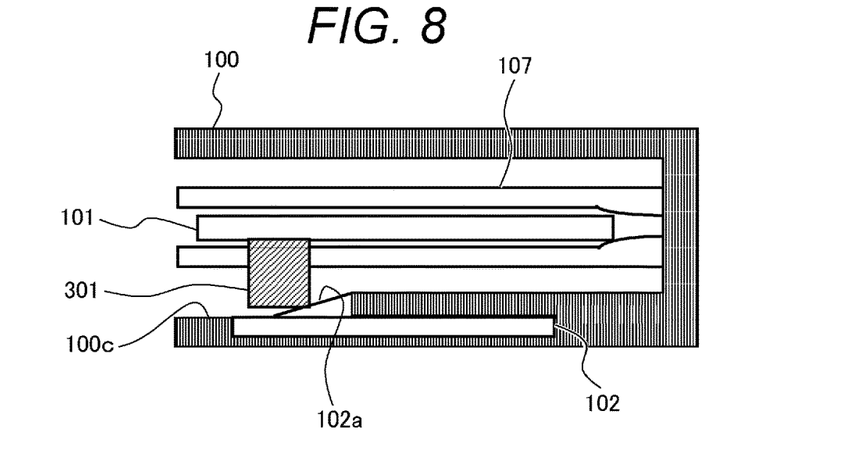
FIG. 8 is a cross-sectional view of the electronic control device 10 in a substrate insertion direction and is a view of connection of the conductive member 102 illustrated in FIGS. 6 and 7 and a conductive substrate mounting member 301.

Next, a modification example of the conductive member 102 will be described with reference to FIGS. 6 to 8. FIG. 6 is a view illustrating the modification example of the conductive member 102 according to the present invention and is a cross-sectional view of the conductive member 102 as viewed from in front thereof (insertion direction of the substrate 101). FIG. 7 is a view illustrating the modification example of the conductive member 102 according to the present invention and is a cross-sectional view of the conductive member 102 as viewed from a side (direction parallel to the electronic component mounting surface 101a of the substrate 101 and perpendicular to the insertion direction of the substrate 101). FIG. 8 is a cross-sectional view of the electronic control device 10 in the substrate insertion direction and is a view of connection of the conductive member 102 illustrated in FIGS. 6 and 7 and a conductive substrate mounting member 301.

FIG. 6 illustrates a VIA-VIA cross section, a VIB-VIB cross section, a VIC-VIC cross section, and a VID-VID cross section of FIG. 7 from the left side of the drawing. A height H of the conductive member 102 provided in the case 100 is adjusted depending on a position facing the conductive surface-mounted member 301 in contact.

As illustrated in FIG. 7, a facing surface 102a of the conductive member 102 which faces the conductive surface-mounted member 301 constitutes a projecting portion projecting from a facing surface 100c of the case 100 which faces the electronic component mounting surface 101a, and a projecting height H of the projecting portion gradually increases from a front side (opening portion 100a side) toward the back side in the insertion direction of the substrate 101. That is, a cross-sectional area of the conductive member 102 which is perpendicular to the insertion direction of the substrate configured to gradually increase toward the back side in the insertion direction of the substrate 101 and is configured to gradually decrease toward the direction opposite to the insertion direction of the substrate 101.

Moreover, in FIG. 7, a region 100d of the case 100 which is formed on the back side with respect to the conductive member 102 has the same height as that of a region where the projecting height H of the conductive member 102 is the highest (a region of the VID-VID cross section) due to die cutting of the case 100. That is, the conductive member 102 is molded integrally with the case 100.

FIG. 8 illustrates a state where the substrate 101 is incorporated in the case 100. An inner surface of the side wall 100b (see FIG. 3) of the case 100 includes the guide 107 into which an edge portion of the substrate 101 is inserted, and the substrate 101 is attached, following the guide 107, to the inside of the case 100. The conductive member 102 in which a facing surface (contact surface) 102a facing the conductive surface-mounted member 301 is configured of an inclined surface on a facing surface 100c of the case 100 which faces the electronic component mounting surface 101a. When the conductive surface-mounted member 301 mounted on the electronic component mounting surface 101a of the substrate 101 comes into contact with the conductive member 102, the signal ground 103, the conductive surface-mounted member 301, and the conductive member 102 have the same electric potential, and the electrical shielding is formed.

The conductive member 102 has the projecting portion 102a, and when the substrate 101 is inserted following the guide 107 into the case 100, the conductive surface-mounted member 301 comes into contact with the conductive member 102 while being crushed by the conductive member 102. With this configuration, even if there are dimensional variations in the conductive member 102, the conductive surface-mounted member 301, and the guide 107, the conductive surface-mounted member 301 and the conductive member 102 can be reliably brought into contact with each other, and the reliability of EMC resistance in the electronic control device 10 is enhanced. In addition, there is no need of accurate dimensional management of the case 100 and the substrate 101.

Figure 9:
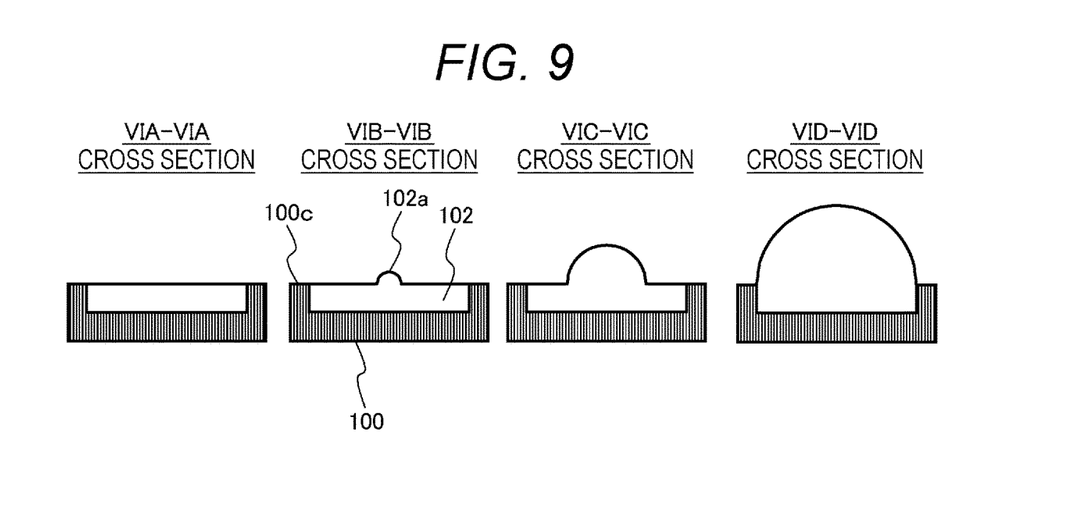
FIG. 9 is a view illustrating another modification example of the conductive member 102 according to the present invention and is a cross-sectional view of the conductive member 102 having a conical projecting portion 102a as viewed from in front thereof.
Figure 10:
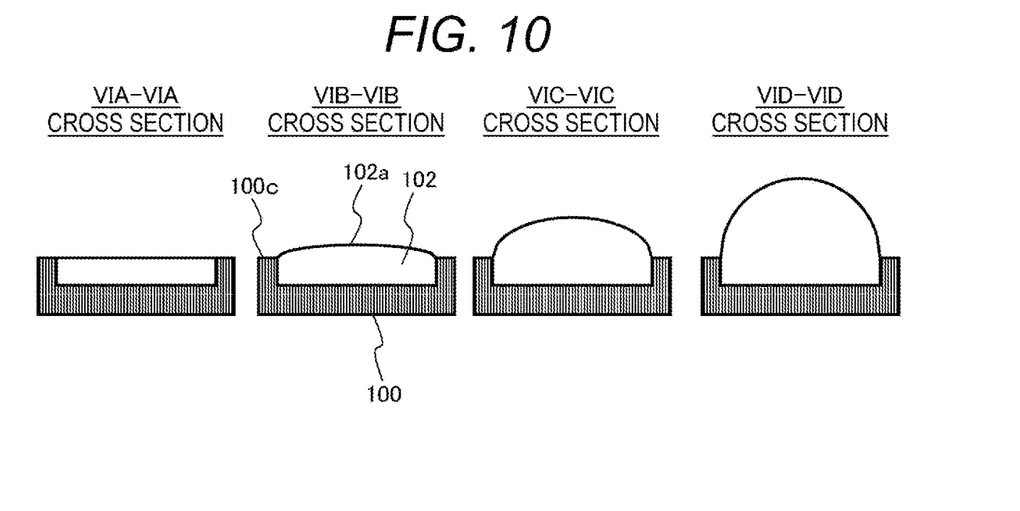
FIG. 10 is a view illustrating still another modification example of the conductive member 102 according to the present invention and is a cross-sectional view of the conductive member 102 having a cylindrical projecting portion 102a as viewed from in front thereof.
Figure 11:
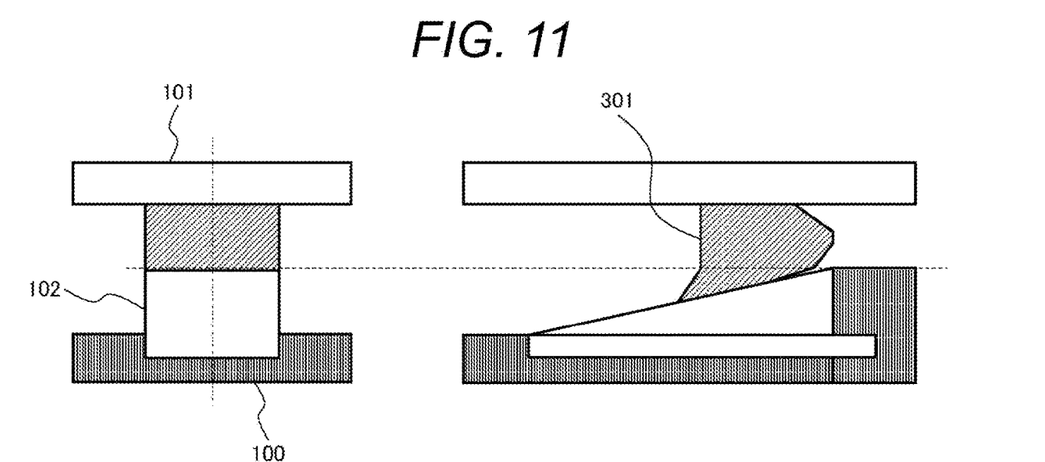
FIG. 11 is an explanatory diagram of stress of the conductive member 102.
Figure 12:
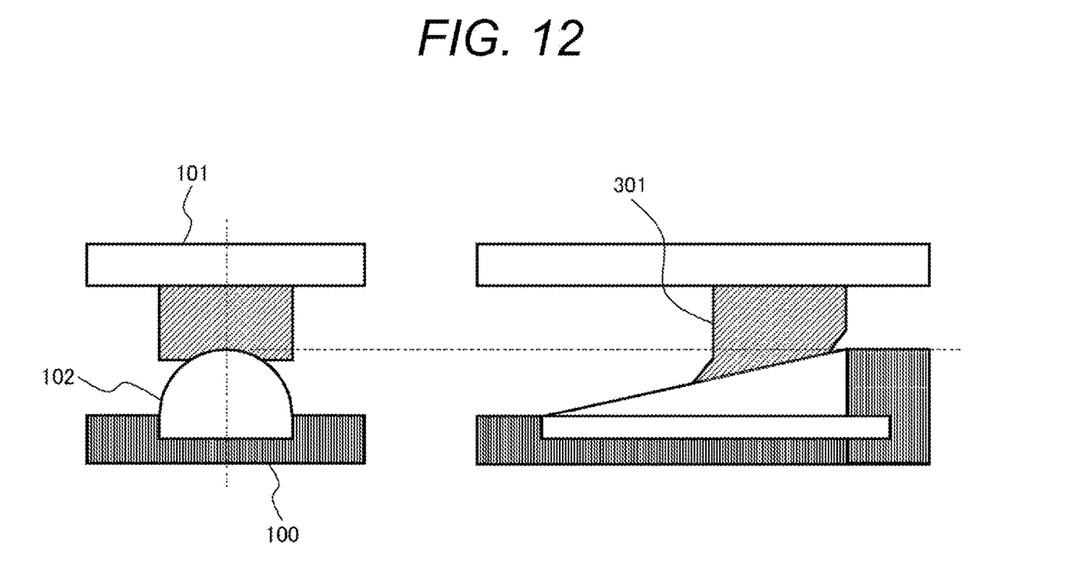
FIG. 12 is an explanatory diagram of stress of the conductive member 102.

Next, the other modification examples of the conductive member 102 will be described with reference to FIGS. 9 to 12. FIG. 9 is a view illustrating another modification example of the conductive member 102 according to the present invention and is a cross-sectional view of the conductive member 102 having a conical projecting portion 102a as viewed from in front thereof. FIG. 10 is a view illustrating still another modification example of the conductive member 102 according to the present invention and is a cross-sectional view of the conductive member 102 having a cylindrical projecting portion 102a as viewed from in front thereof. FIGS. 11 and 12 are explanatory diagrams of stress of the conductive member 102, FIG. 11 is an explanatory diagram of stress when a cross section perpendicular to the insertion direction of the substrate 101 has a rectangular shape, and FIG. 12 is an explanatory diagram of stress of the conductive member 102 illustrated in FIGS. 9 and 10. Moreover, similarly to FIG. 6, FIGS. 9 and 10 illustrate cross sections corresponding to the VIA-VIA cross section, the VIB-VIB cross section, the VIC-VIC cross section, and the VID-VID cross section of FIG. 7.

In the modification example of FIG. 9, a shape of the projecting portion 102a is a semi-conical shape. In addition, in the modification example of FIG. 10, the shape of the projecting portion 102a is a semi-cylindrical shape. In the examples of FIGS. 9 and 10, a front end (top portion) of the projecting portion 102a comes into point contact with the conductive surface-mounted member 301.

The explanatory diagram of stress illustrated in FIG. 11 is an explanatory diagram of stress in the case of the projecting portion 102a as illustrated in FIGS. 6 and 7, for example. In the case of the projecting portion 102a as illustrated in FIGS. 6 and 7, an area of a contact portion (connection portion) increases when the conductive member 102 comes into contact with the conductive surface-mounted member 301. Therefore, the stress generated in the conductive surface-mounted member 301 increases, and the conductive surface-mounted member 301 is easily peeled off from the substrate 101. In this case, the projecting portion 102a of the conductive member 102 and the conductive surface-mounted member 301 are processed with predetermined shape accuracy in consideration of a contact force between the conductive member 102 and the conductive surface-mounted member 301 and the stress generated in the conductive surface-mounted member 301.

On the other hand, in the examples of FIGS. 9 and 10, the projecting portions 102a have a curve in which a shape of a surface in the cross section perpendicular to the insertion direction is high at the central portion of the cross section and becomes lower as approaching both end portions of the cross section, and has a shape in which an area of the cross section perpendicular to the insertion direction increases in the insertion direction. In addition, the example also has such a configuration in which a cross-sectional area of the conductive member 102 perpendicular to the insertion direction of the substrate 101 gradually increases toward the back side in the insertion direction of the substrate 101. Examples of such a shape include a tapered shape as illustrated in FIG. 9, more specifically, a semi-conical shape, and a shape as illustrated in FIG. 10 (referred to as a semi-cylindrical shape in this example). The front end (top portion) of the projecting portion 102a in the projecting direction comes into contact with the conductive surface-mounted member 301. In the example, an area of a contact portion (connection portion) between the conductive surface-mounted member 301 and the projecting portion 102a is reduced, so that stress generated in the conductive surface-mounted member 301 can be reduced. In this case, an effect that the conductive surface-mounted member 301 is hardly peeled off from the substrate 101 is obtained.

In the examples of FIGS. 9 and 10, the conductive member 102 can be further reduced in shape, and the cost can be reduced. Since the shape accuracy of the projecting portion 102a of the conductive member 102 and the conductive surface-mounted member 301 can be loosened, the cost can be reduced.

Figure 13:
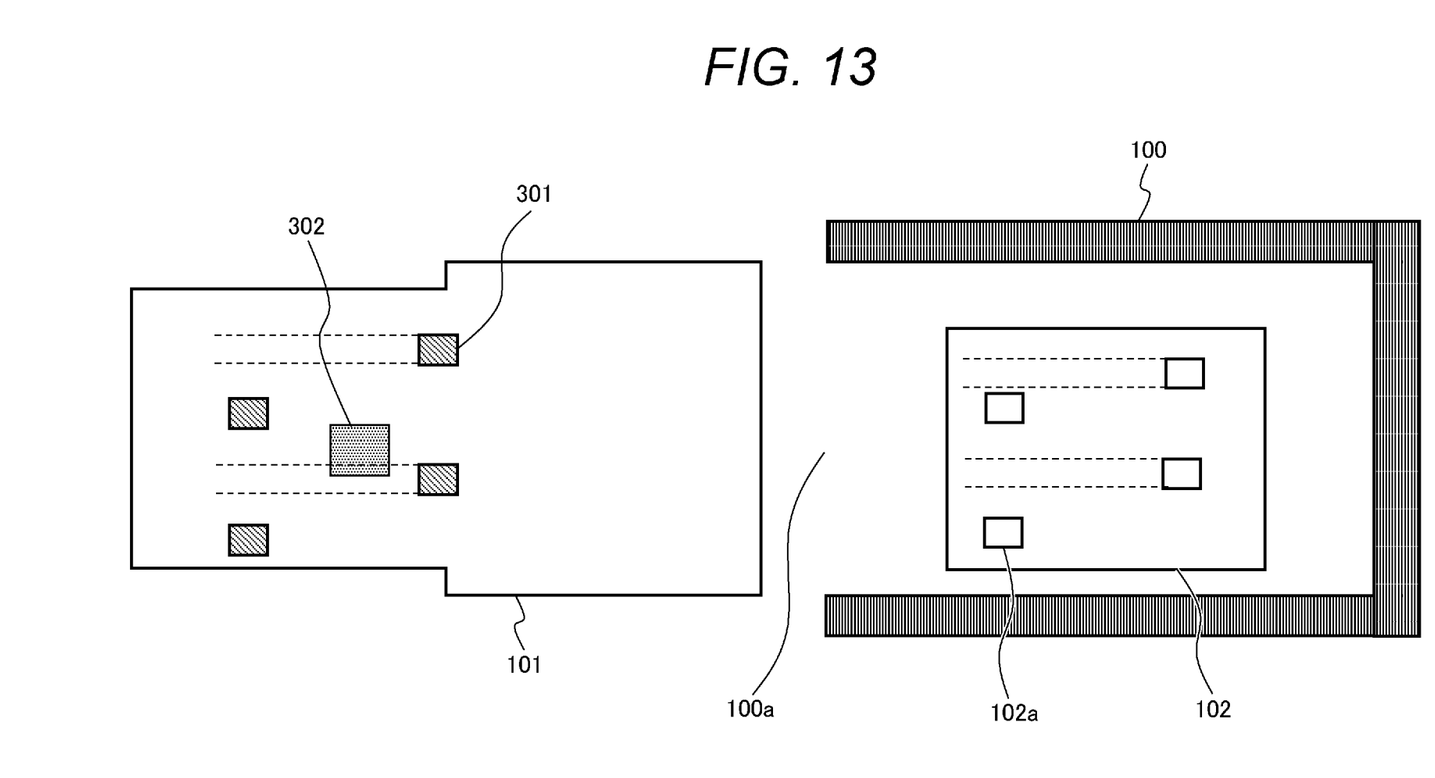
FIG. 13 is a view of connection of a conductive surface-mounted member 301 and a conductive member 102 in an electronic control device 10 according to another example of the present invention.

Next, the arrangement of the conductive surface-mounted members 301 will be described with reference to FIG. 13. FIG. 13 is a view of connection of conductive surface-mounted members 301 and a conductive member 102 in an electronic control device 10 according to another example of the present invention.

When the plurality of conductive surface-mounted members 301 are arranged at positions overlapping with each other in the insertion direction, the conductive member 102 disposed on the front side (opening portion 100a side) is crushed by the conductive surface-mounted member 301 which is to be connected to the conductive member 102 on the back side when the substrate 101 is inserted, and there is a possibility that the conductive member cannot be connected to the conductive surface-mounted member 301 to which the conductive member is to be originally connected. To solve this problem, as illustrated in FIG. 13, the plurality of conductive surface-mounted members 301 are arranged at positions not overlapping each other in the insertion direction of the substrate 101. That is, the plurality of conductive surface-mounted members 301 are arranged so as not to overlap each other in a width direction parallel to the electronic component mounting surface 101a of the substrate 101 and perpendicular to the insertion direction (depth direction) of the substrate 101.

With such a configuration, it is possible to avoid damaging the conductive member 102 by the conductive surface-mounted member 301 with which the conductive member 102 is brought into contact other than the conductive surface-mounted member 301 to which the conductive member 102 is originally to be connected.

Figure 14:
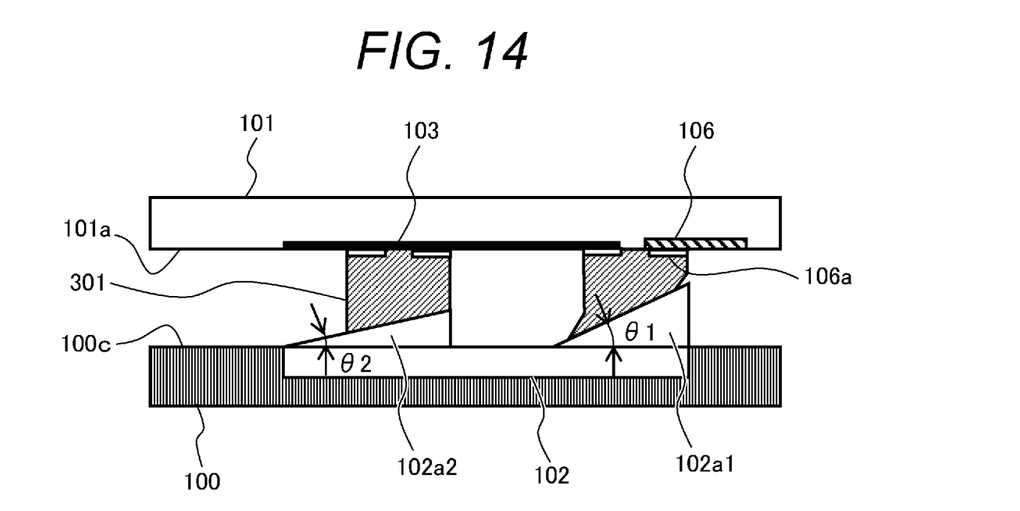
FIG. 14 is a cross-sectional view of the electronic control device 10 in a substrate insertion direction according to the example of the present invention.
Figure 15:
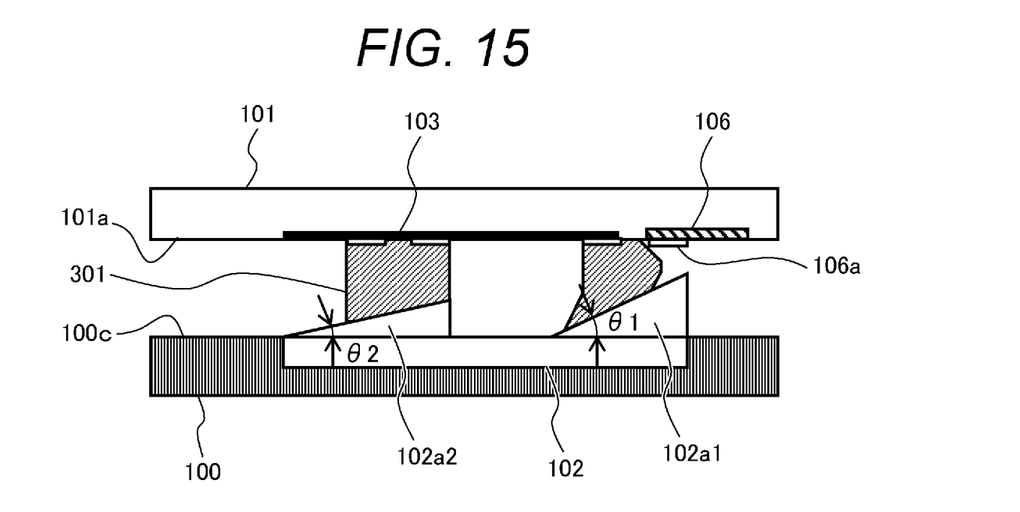
FIG. 15 is a cross-sectional view of the electronic control device in the substrate insertion direction when peeling occurs in the conductive surface-mounted member 301.
Figure 16:
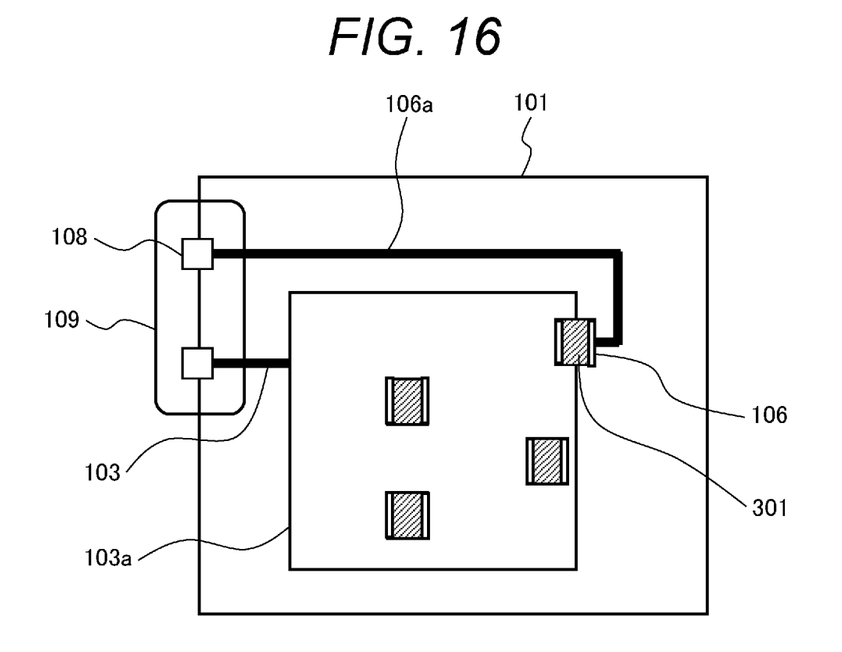
FIG. 16 is a top view of a substrate 101 used in an electronic control device 10 according to the example of the present invention.

Next, still another modification example of the conductive member 102 will be described with reference to FIGS. 14 to 16. FIG. 14 is a cross-sectional view of the electronic control device 10 in the substrate insertion direction according to the example of the present invention. FIG. 15 is a cross-sectional view of the electronic control device in the substrate insertion direction when peeling occurs in the conductive surface-mounted member 301. FIG. 16 is a top view of the substrate 101 used in an electronic control device 10 according to the example of the present invention.

As illustrated in FIGS. 14 and 15, a plurality of projecting portions 102a of the conductive member 102 are provided to correspond to the number of conductive surface-mounted members 301. In addition, one projecting portion 102a1 of the plurality of projecting portions 102a is configured to have a steeper inclination of a surface which comes into contact with the conductive surface-mounted member 301 than the other projecting portions 102a2. That is, an inclination angle θ1 of an inclined surface of the one projecting portion 102a1 is set to an angle (steep inclination angle) larger than an inclination angle θ2 of an inclined surface of the other projecting portion 102a2 (θ1>θ2).

In the examples of FIGS. 14 and 15, a combination of the conductive surface-mounted member 301 and the projecting portion 102a1 to which stress is likely to be applied is intentionally provided. This is because examination of the conductive surface-mounted member 301 at a location where stress is likely to be applied eliminates the need for all of the other inspections. That is, if the conductive surface-mounted member 301 is attached to the conductive member 102 at a position where stress is likely to be applied, it can be determined that the conductive surface-mounted members 301 to which stress is less likely to be applied is attached to the conductive member 102.

In addition, as illustrated in FIG. 16, a pad 106 of the substrate 101 to which the conductive surface-mounted member 301 that is in contact with the one projecting portion 102a1 is electrically connected to a pin connector 109 via a signal line 106a. In the electrical characteristics inspection, whether a current flow through the conductive surface-mounted member 301 that is in contact with the projecting portion 102a1 can be checked through the pin connector 109. As illustrated in FIG. 14, when the conductive surface-mounted member 301 and the conductive member 102 are electrically connected, electricity flows through the pin connector 109. On the other hand, as illustrated in FIG. 15, when the conductive surface-mounted member 301 is peeled off, a current does not flow through the pin connector 109.

By performing an open short check through the pin connector 109 for the conductive surface-mounted member 301 to which the maximum stress is applied when the substrate 101 is inserted into the case 100, open and short can be checked for the plurality of conductive surface-mounted members 301. This open short check can be performed using a conventional shipping inspection method (apparatus). Therefore, there is no need to use a new inspection process and apparatus, and the cost can be reduced.

Figure 17:
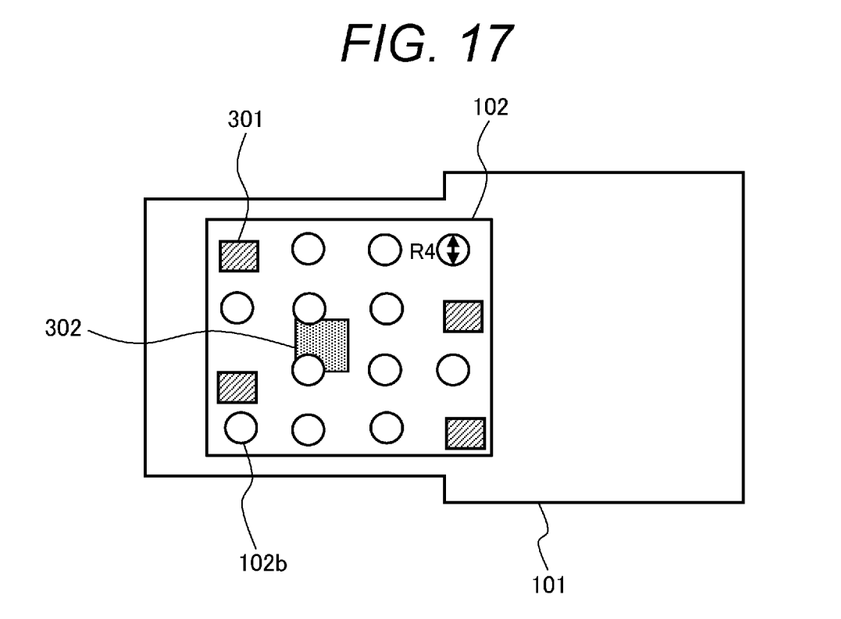
FIG. 17 is a top view of a substrate 101 used in an electronic control device 10 according to still another example of the present invention.

Next, still another modification example of the conductive member 102 will be described with reference to FIG. 17. FIG. 17 is a top view of a substrate 101 used in an electronic control device 10 according to the example of the present invention.

As illustrated in FIG. 17, a region of the conductive member 102 that does not come into contact with the conductive surface-mounted member 301 is punched by, for example, a punch or the like to form a pit 102b. For the sake of explanation, a diameter of the pit 102b is referred to as R4.

Since a diameter (L4) of the pit 102b causes resonance at λ/2 and the amount of electromagnetic interference (EMI) radiation is maximized, the diameter (L4) of the pit 102b is set to be smaller than λ/2 with respect to the wavelength λ of the noise component emitted by the electronic component 302 for the same reason as in the description of Example 3. With such a configuration, the noise radiation up to λ/2 can be reduced. Further, in adjusting the diameter (L4) of the pits 102b, it is possible to reduce the weight of the electronic control device 10 and to reduce the material costs by maximizing the number of the pits 102b.

According to the above-described examples and modification examples according to the present invention, the signal ground 103, the conductive surface-mounted member 301, and the conductive member 102 have the same electric potential around the noise source, so that the electrical shielding can be formed, and as a result, the radiation noise can be reduced. In addition, use of the resin case 100 enables cost reduction. In addition, since only the conductive surface-mounted member 301 is mounted on the substrate 101 without mounting a shield on the substrate 101, it is possible to perform the AOI and the ICT after assembling the substrate. Therefore, there is no need to use new inspection equipment, and the costs can be reduced. Further, if the substrate is inserted sliding, there is no need to perform a process of screwing the cover and the case, so that the costs can be further reduced.

Moreover, the present invention is not limited to the above-described examples and includes various modification examples. For example, the above-described examples have been described in detail in order to describe the present invention in an easy-to-understand manner and are not necessarily limited to those having all the configurations. In addition, it is also possible to add, remove, and replace another configuration to, from, and by some of the configurations of the examples.

REFERENCE SIGNS LIST 100 cylindrical resin case
101 substrate
102 conductive member
102a projecting portion of conductive member 102
102b pit
103 signal ground
104 connector
105 cover
106 pad
106a signal line
107 guide
109 pin connector
301 conductive surface-mounted member
302 electronic component (noise source)

The invention claimed is:

1. An electronic control device comprising: a substrate; an electronic component disposed on an electronic component mounting surface of the substrate; and a resin case that houses the substrate,
wherein the case includes a conductive member on a surface facing the electronic component mounting surface of the substrate,
the substrate includes a plurality of conductive surface-mounted members mounted on the electronic component mounting surface to surround the electronic component, and
the plurality of conductive surface-mounted members are arranged to be separated from each other on the electronic component mounting surface and form electrical shielding by coming into contact with the conductive member.

2. The electronic control device according to claim 1, wherein an arrangement interval of the plurality of conductive surface-mounted members is smaller than $\lambda/2$ with respect to a wavelength $\lambda$ of a noise component emitted by the electronic component.

3. The electronic control device according to claim 1, wherein
one or more projecting portions are formed by projecting from a facing surface of the case which faces the electronic component mounting surface, and
a projecting height of the one or more projecting portions gradually increases from a front side to a back side in an insertion direction of the substrate.

4. The electronic control device according to claim 3, wherein a cross-sectional area of the projecting portion perpendicular to the insertion direction decreases in a direction opposite to the insertion direction.

5. The electronic control device according to claim 4, wherein the projecting portion has a tapered shape, and a front end of the projecting portion in a projecting direction is brought into contact with the conductive surface-mounted member.

6. The electronic control device according to claim 5, wherein the projecting portion has a semi-conical shape, and a front end of the projecting portion in a projecting direction is brought into contact with the conductive surface-mounted member.

7. The electronic control device according to claim 4, wherein the projecting portion has a semi-cylindrical shape, and a front end of the projecting portion in a projecting direction is brought into contact with the conductive surface-mounted member.

8. The electronic control device according to claim 3, wherein the plurality of conductive surface-mounted members are arranged so as not to overlap each other in a width direction parallel to the electronic component mounting surface of the substrate and perpendicular to the insertion direction.

9. The electronic control device according to claim 3, wherein
a number of the one or more plurality of the projecting portions is equal to a number of the conductive surface-mounted members, and
an inclination of a surface of a first projecting portion of the one or more projecting portions is steeper than an inclination of a surface of each of the other projecting portions, wherein the surface of the first projecting portion is in contact with the conductive surface-mounted member.

10. The electronic control device according to claim 9, wherein a pad of the substrate to which the conductive surface-mounted member is in contact with the first projecting portion is electrically connected to a connector by a signal line.

11. The electronic control device according to claim 1, wherein
a region of the conductive member which is not in contact with the conductive surface-mounted member is punched, and
a diameter of a pit opened is smaller than $\lambda/2$ with respect to a wavelength $\lambda$ of a noise component.

12. The electronic control device according to claim 1, wherein the conductive member is a metal plate.

13. The electronic control device according to claim 1, wherein the conductive member is made of a conductive resin.

* * * * *